United States Patent [19]

Atkinson et al.

[11] Patent Number: 5,166,037
[45] Date of Patent: Nov. 24, 1992

[54] METHOD OF ADDITIVE CIRCUITIZATION OF CIRCUIT BOARDS WITH HIGH ADHESION, VOIDLESS COPPER LEADS

[75] Inventors: John M. Atkinson, Endwell; Russell E. Darrow, Endicott; John D. Larnerd, Owego; Ronald J. Moore, Binghamton, all of N.Y.

[73] Assignee: International Business Machines Corporation, Armonk, N.Y.

[21] Appl. No.: 655,479

[22] Filed: Feb. 14, 1991

[51] Int. Cl.⁵ .......................... B05D 3/00; G03C 5/00
[52] U.S. Cl. .................................. 430/315; 430/311; 430/313; 205/125; 205/159; 205/205; 205/210; 205/211
[58] Field of Search ............... 430/311, 313, 315, 329, 430/330, 331; 204/30, 32.1, 35.1, 52.1; 205/125, 159, 205, 210, 211

[56] References Cited

U.S. PATENT DOCUMENTS 4,268,536 5/1981 Beckenbaugh ...................... 430/315
4,576,685 3/1986 Goffredo ............................... 204/30

OTHER PUBLICATIONS

IBM TDB "Method for Through Hole Plating Void Elimination", J. V. Pridans and C. M. Sekora, vol. 21, No. 6, Nov. 1978.
Hitachi, JA Kokai 60-217695, Electroless Plated Printed Circuit Board Manufacture.

Primary Examiner—Marion E. McCamish
Assistant Examiner—Kathleen Duda
Attorney, Agent, or Firm—Richard M. Goldman; John D. Flynn

[57] ABSTRACT

Disclosed is a method of fabricating a microelectronic package, especially a microelectronic package having copper circuitization on a dielectric substrate. The method includes the steps of depositing, imaging, developing the photoresist for additive circuitization, and forming a pattern of copper circuitization on the so exposed portions of the package. In order to avoid the formation of deleterious air bubbles on the exposed walls of the imaged and developed resist, the panel is exposed to and wetted by a liquid mist.

14 Claims, 3 Drawing Sheets

METHOD OF ADDITIVE CIRCUITIZATION OF CIRCUIT BOARDS WITH HIGH ADHESION, VOIDLESS COPPER LEADS

FIELD OF THE INVENTION

The invention relates to the fabrication of microelectronic circuit packages. The circuit packages have circuitization metallization. Generally, this metallization is multi-layer, with a chromium adhesion layer sputtered onto the dielectric, and a copper "seed" layer deposited onto the chromium adhesion layer.

In additive circuitization, photoresist is applied atop the "seed" copper, imaged, and developed to expose areas where circuitization is to be applied. The circuitization, i.e., copper circuitization, is deposited atop the seed layer, between walls of photoresist. Air bubbles adhere to the organic, hydrophobic photoresist as the photoresist bearing part is immersed in the aqueous copper plating solution. The presence of these air bubbles results in copper plating voids in the circuit lines.

The invention relates to a misting presoak, that is a water vapor or fog presoak. The mist presoak neither introduces organic surfactants into the systems, nor does it reduce the adhesion of the photoresist.

After application of the circuitization in a desired pattern, the non-circuitized regions still have photoresist, "seed" copper, and a chromium adhesion layer underneath the "seed" copper. The photoresist, the copper "seed" layer, and the chromium adhesion layer are then removed leaving a circuitized package.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, New York, (1988), and Rao R. Tummala and Eugene J. Rymaszewski, *Microelectronic Packaging Handbook*, Van Nostrand Reinhold, New York, New York (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

There is frequently a third level of packaging. This is the "board." The board carries both first and second level packages.

Packages may be characterized by the material used as the dielectric, i.e., as ceramic packages or as polymeric packages. The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853–922, also previously incorporated herein by reference.

In the normal process for package fabrication a fibrous body, such as a non-woven mat or woven web, is impregnated with a resin. This step includes coating the fibrous body with, for example, an epoxy resin solution, evaporating the solvents associated with the resin, and partially curing the resin. The partially cured resin is called a B-stage resin. The body of fibrous material and B stage resin is called a prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers. One epoxy prepreg is the FR-4 prepreg. FR-4 is a fire retardant epoxy-glass cloth material, where the epoxy resin is the diglycidyl ether of 2,2'bis(4-hydroxyphenyl) propane. This epoxy resin is also known as the diglycidyl ether of bisphenol-A, (DGEBA). The fire retardancy of the FR-4 prepreg is obtained by including approximately 15-20 weight percent bromine in the resin. This is done by partially substituting brominated DGEBA for the DGEBA.

Other epoxy resin formulations useful in providing prepregs include high functionality resins, such as epoxidized cresol novolacs, and epoxidized derivatives of etriphenyl methane. The multifunctional epoxy resins are characterized by high glass transition temperatures, high thermal stability, and reduced moisture take up.

Still other epoxy resins are phenolic cured epoxies, as Ciba-Giegy RD86-170 ™, Ciba-Giegy RD87-211 ™, Ciba-Giegy RD87-212 ™, Dow Quatrex ®5010 ™, Shell Epon ®, and the like. These epoxies are mixtures of epoxies, with each epoxy having a functionality of at least 2, a phenolic curing agent with a functionality of at least 2, and an imidazole catalyst.

Cyanate ester resins are also used in forming prepregs. One type of cyanate ester resin includes dicyanates mixed with methylene dianiline bis-maleimide.

This product may be further blended with compatible epoxies to yield a laminate material. One such laminate material is a 50:45:5 (parts by weight) of epoxy: cyanate: maleimide. Typical of cyanate ester resins useful in forming prepregs is the product of bisphenol-A dicyanate and epoxy, which polymerizes during lamination to form a crosslinked structure.

A still further class of materials useful in forming prepregs for rigid multilayer boards are thermosetting polyimides. While thermosetting polyimides exhibit high water absorption, and high cost, they have good thermal properties and desirable mechanical properties. The preferred polyimides for prepreg use are addition products such as polyimides based on low molecular weight bis-maleimides.

Subsequent processing of polymeric substrates includes circuitization, that is, the formation of a Cu signal pattern or power pattern on the prepreg, or lamination of the prepreg to a power core. Circuitization may be additive or subtractive.

An alternative package is Tape Automated Bonding (TAB). The TAB structure and process is described by Nicholas G. Koopman, Timothy C. Reiley, and Paul C. Totta, *Chip To Package Interconnections*, at pages 361–453, and especially pages 409–437 of R.R. Tummala and E. J. Rymaszewski, *Microelectronics Packaging Handbook*, previously incorporated herein by reference, and Charles G. Woychik and Richard C. Senger, *Joining Materials and Processes in Electronic Packaging*, at pages 577–619, and especially pages 580–583 of Donald P. Seraphim, Ronald Lasky, and Che-Yu Li, *Principles of Electronic Packaging*, previously incorporated herein by reference.

The TAB process involves bonding an IC chip to patterned metal on a polymer tape. Typically the polymer tape is a polyimide tape, although it may be polyester or poly perfluorocarbon, and the patterned metal is copper, for example a patterned copper film about 20 to about 40 microns thick. Adhesion of the copper to the polymer is obtained by plating the copper onto a multilayer of sputtered chromium and copper layers, each about 1 micron thick. This Cr-Cu multilayer provides a plating base for the Cu circuitization. The Cu circuitization is applied by vapor deposition or sputtering, and photolithographically patterned. Cu circuitization feature size is on the order of 50 microns.

An alternative TAB structure is formed by the spray deposition of polyimide. Thereafter the copper and the polyimide are patterned by etching with suitable etchants.

Bonding of the IC chip to the copper leads is typically by thermal compression bonding or gold-tin liquid phase bonding to peripheral interconnections of the active device. The outer pads are soldered to the next level of packaging.

A still further alternative package is flexible film packaging, also known as flex packaging. Flex packaging is described by Donald P. Seraphim, Donald E. Barr, William T. Chen, George P. Schmitt, and Rao R. Tummala, *Printed Circuit Board Packaging*, at pages 853–921, and especially pages 870–872 of R.R. Tummala and E. J. Rymaszewski, *Microelectronics Packaging Handbook*, previously incorporated herein by reference.

Flexible film packages are generally similar to prepreg based circuit packages, however they are thinner then pre-preg based printed circuit boards, and are fabricated from polyimide or polyester rather than epoxy-glass fiber.

A still further alternative package is a package formed as a lamination of a circuitized polymeric film and a metal substrate. This is exemplified by a package formed of a copper circuitized polyimide film on a copper-Invar-copper substrate.

All of the above described package configurations can be circuitized by additive circuitization. In additive circuitization a thin film of an adhesion layer, such as a thin film of chromium, is first applied to the substrate. The adhesion layer may be applied by various methods, including, by way of example, evaporation, electroless deposition, electrodeposition, sputtering, or similar techniques. Typically, the film of adhesion metal is from about 500 Angstroms to about 2000 Angstroms. Thicker layers of chromium result in internal streses, while thinner layers may be non-continuous.

Thereafter a "seed" layer of copper is applied atop the adhesion layer. This copper layer is typically from about 3000 Angstroms thick to about 25,000 Angstroms (2.5 microns) thick. It may be applied by sputtering, electrodeposition, or electroless deposition.

Subsequently, photoresist is applied atop the copper "seed" layer, imaged, and developed to provide a pattern for circuit deposition. Copper circuitization is then plated onto the "seed" layer between wall of the organic, hydrophobic photoresist to provide the circuitization pattern on the surface of the package. The remaining photoresist is then stripped, leaving a thick copper plated circuitization pattern and a thin multilayer "background" of a "seed" copper- chromium adhesion layer.

The "seed" copper can be etched by various methods well known in the art. The resulting circuitized prepreg is called a core.

The composite printed circuit package is fabricated by interleaving cores (including signal cores, signal/signal cores, power cores, power/power cores, and signal/power cores) with additional sheets of prepreg, and surface circuitization. Holes, as vias and through holes, may be drilled in individual core structures, for example, before or after circuitization, as described above, or in partially laminated modules.

Returning to the deposition of the Cu circuitization, a presoak operation is necessary for thin film circuit layers and panels prior to circuitization. This presoak is necessary to remove the tiny air bubbles that adhere to the walls of the organic, hydrophobic photoresist as the panel or layer is immersed into the plating solution for the first time.

The presence of these air bubbles results in copper plating voids in the copper circuit lines. Various expedients have been tried to remove these gas bubbles, and thereby eliminate the voids in the circuit traces. For example, a vacuum process has been suggested, but this vacuum process has been shown to have a deleterious effect on the adhesion of the photoresist to the panel or layer. Alternatively, a prolonged water soak is used to remove the bubbles. This long presoak results in a diminished process throughput. A further effect of the long presoak is the introduction of contaminants, as surfactants, wetting agents, dispersants, and inorganics, among others, into the panel surface.

OBJECTS OF THE INVENTION

It is one object of the invention to provide packages, especially high density cards, boards, and other packages, prepared using photoresist in an additive plating process.

It is another object of the invention to avoid the formation of air bubble induced voids in the copper circuitization.

It is a further object of the invention to substantially avoid a vacuum process, with its attendant likelihood of reducing the adherence of the photoresist to the panel or layer.

It is a still further object of the invention to remove the air bubbles without a loss or diminution in process throughput.

It is a still further object of the invention to avoid formation of air bubbles while avoiding a long presoak with the attendant likliehood of introducing contaminants into the package surface.

SUMMARY OF THE INVENTION

These and other objects are obtained by the microelectronic circuit package fabrication method of the invention. The fabrication method is useful for fabricating a microelectronic package having copper surface circuitization.

The fabrication method provides an environment of a liquid mist for wetting the circuit panels and layers. "Panels" as used herein refers to packages, including cards and boards, as well as assemblies of packages fabricated as a single unit simultaneously and then divided into packages. It is to be understood that the method of the invention can be used for the additive circuitization of any level of microelectronic circuit package, as cards, boards, or composite panels thereof, as well as for any type of package, as pre-preg, flexible film, TAB, polymer on metal, ceramic, and multi-layer ceramic packages.

A circuit panel is subjected to this liquid mist prior to passing through the presoak tank, if any, and the plating solution. By the method of the invention the walls of the organic, hydrophobic photoresist, as well as the areas between these organic, hydrophobic photoresist walls are prewetted with very fine droplets of the liquid within the mist. This is accomplished without entraining air bubbles.

The liquid mist may be either water or an organic solvent, with water preferred, and deionized water (DI water) especially preferred. The mist may be at either ambient temperature (approximately 27 degrees Centigrade) or at elevated temperature, with ambient temperature mist preferred. The mist, especially an ambient temperature mist, may be provided by a humidifier, especially an ultrasonic humidifier. The method of the invention may be used for either rigid panels, as pre-preg, polymer on metal, or ceramic substrates, or for flexible roll to roll substrates, as flex or TAB substrates.

BRIEF DESCRIPTION OF THE DRAWINGS

The invention must be understood by reference to the Figures.

DETAILED DESCRIPTION OF THE INVENTION

Figure 1:
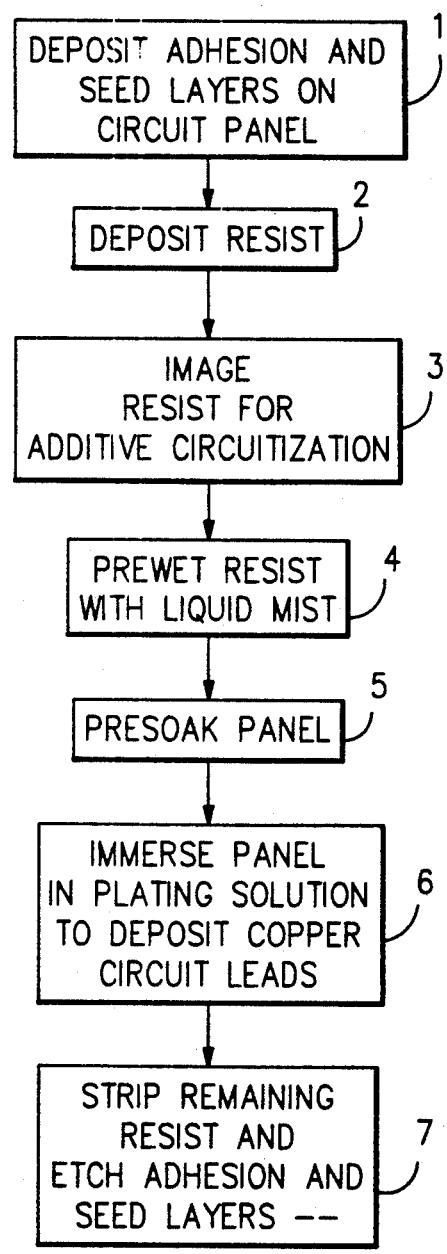
FIG. 1 is a flow chart of the method of the invention.

The method of the invention is illustrated in the flow chart of FIG. 1. FIG. 1 illustrates a flow chart of a microelectronic circuit package fabrication having misting of the circuit layer after imaging and developing the photoresist, but before depositing the copper. The method of the invention is useful in the additive circuitization of any level of microelectronic circuit package, i.e., a card, board, or panel, with any type of substrate, i.e., prepreg, flexible circuit, TAB, polymer on metal, or ceramic, utilizing a hydrophobic resist.

More specifically, the microelectronic circuit package fabrication of the invention starts with a circuit panel or board that that is plated with an adhesion layer or layers, and a seed layer or layers, followed by resist. These steps are shown in blocks 1 and 2 of FIG. 1. Thereafter, the resist is imaged, as by screening or lithography, to expose the substrate, that is, the adhesion and seeding layers of the panel, if present, intended to carry circuitization leads. The remainder of the card or board remains covered by resist, for additive circuitization. This is shown in block 3 of FIG. 1.

Thereafter, the method provides an environment of a liquid mist for wetting the circuit panels and layers. This is shown in block 4 of FIG. 1. Specifically, the exposed vertical walls of the imaged and developed resist are exposed to the liquid mist for a long enough time to wet the walls without forming air bubbles thereon. The circuit panel is subjected to this liquid mist prior to passing through the presoak tank, if any, as shown in block 5 of FIG. 1, and the plating solution, as shown in block 6 of FIG. 1. Thereafter the remaining resist is stripped, exposing seed and adhesion layers, which are removed, for example, by etching, as shown in block 7 of FIG. 1.

By the method of the invention the vertical walls of the organic, hydrophobic photoresist, that is, the surfaces of resist exposed by imaging and developing, as well as the areas between these organic, hydrophobic photoresist walls are prewetted with very fine droplets of the liquid within the mist. This is accomplished without entraining air bubbles.

The liquid mist may be either water or an organic solvent, with water preferred. Deionized water (DI water) is especially preferred because it does not introduce possible failure sites into the copper plate, as voids or deposits of contaminants. A further advantage of DI water is that it does not create post-treatment or disposal problems.

The mist may be at either ambient temperature or at elevated temperature, with ambient temperature mist preferred. The mist, especially an ambient temperature mist, may be provided by a humidifier, especially an ultrasonic humidifier. The method of the invention may be used for either rigid panels or for roll to roll substrates. This is shown in FIGS. 2 and 3.

Figure 2:
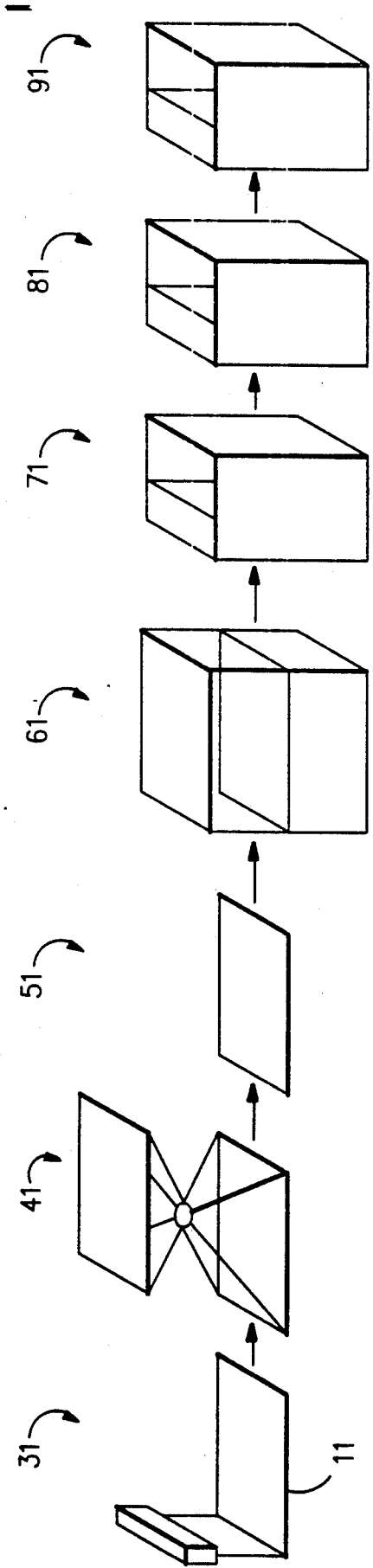
FIG. 2 is a schematic representation of a misting chamber and a plating tank in sequence with the chamber for rigid boards and panels.

FIG. 2 shows a panel 11 going through a photolithographic process 21, including deposition of resist 31, imaging the resist 41, and developing the resist 51. Thereafter, the panel passes through a liquid mist zone 61 and a presoak tank 71. The presoak is followed by plating of the copper circuitization 81, and next by stripping the remaining resist 91, and removal of the seed and adhesion layers, if any.

Figure 3:
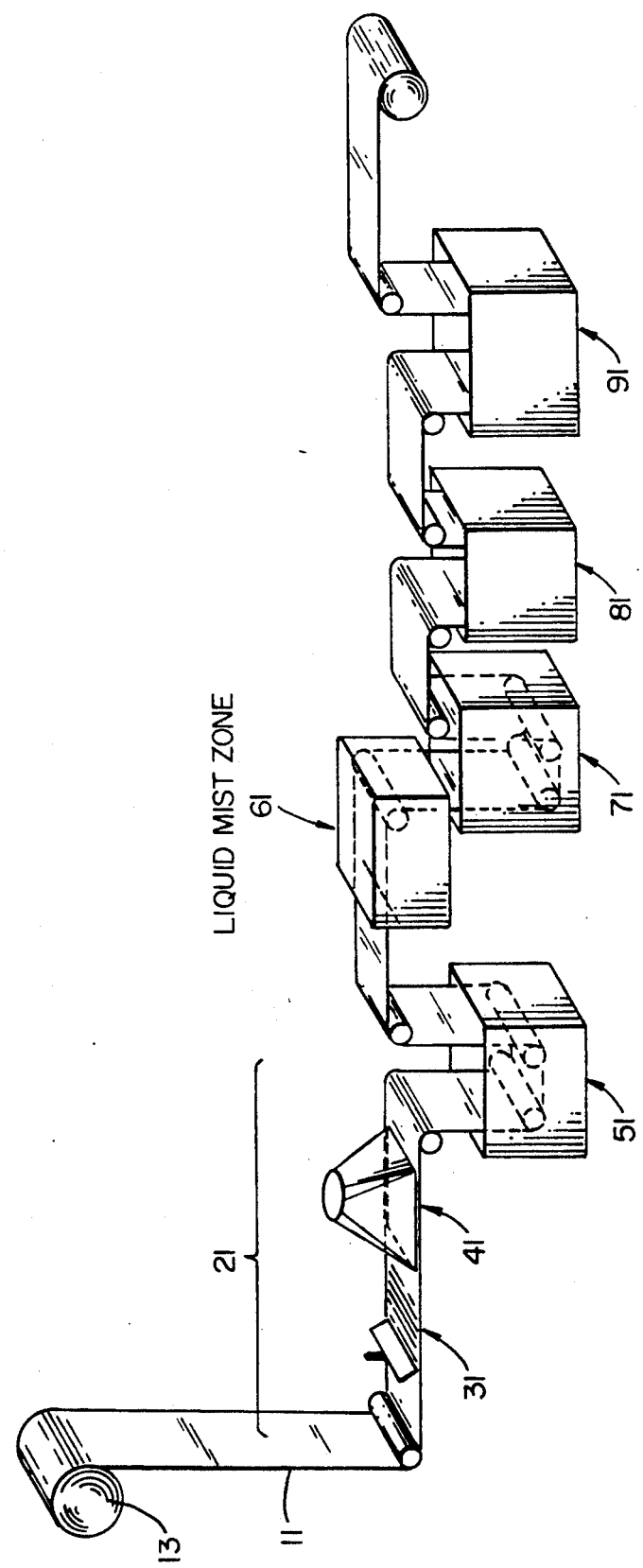
FIG. 3 is a schematic representation of a combined misting chamber and plating tank sequence for flexible circuits.

FIG. 3 shows a roll to roll process, useful with a flexible circuit material or a TAB material. It shows a flexible substrate panel 11 going from a feed roll 13, through a photolithographic process 21, including deposition of resist 31, imaging the resist 41, and developing the resist 51. Thereafter, the panel passes through a liquid mist zone 61 and a presoak tank 71. The presoak is followed by plating of the copper circuitization 81, and next by stripping the remaining resist 91, and removal of the seed and adhesion layers, if any. The flexible circuit panel is then collected on a take up roll 15.

The mist may be formed by, for example ultrasonic humidification. Ultrasonic humidification is especially advantageous because it provides an ambient temperature mist.

According to the method disclosed herein a high degree of circuit lead adhesion is attained. This is because the misting appears to avoid the formation of air bubble induced voids in the copper circuitization. Moreover, the avoidance of voids within the copper circuitization is achieved without a vacuum process, with its attendant likelihood of reducing the adherence of the photoresist to the panel or layer. Moreover, the air bubbles are removed without a long and slow presoak and its problems. These problems includes a loss or diminution in process throughput, as well as the possible introduction of voids and contaminants. Contaminants, such as residual surfactants, wetting agents, and dispersants, as well as inorganic ions, can cause failures in the circuitization.

The method of the invention can also be used to fabricate a microelectronic circuit package panel having vias or through holes. In this alternative embodiment, after forming the vias or through holes, the via or through holes interior surfaces are wetted the with a deionized water aqueous mist. This forms a substantially bubble free environment for making bubble free deposits within the vias or through holes.

While the invention has been described with respect to certain preferred embodiments and exemplifications, it is not intended to limit the scope of the invention thereby, but solely by the claims appended hereto.

We claim:

1. A method of fabricating a microelectronic circuit package comprising: depositing resist on a panel to be circuitized, imaging the resist by exposing and developing the resist to define portions of the panel intended to be circuitized, wetting the imaged resist and panel with a mist of very fine droplets, immersing the mist wetted panel into a copper plating solution, and depositing copper onto regions of the panel not overlaid with imaged resist to form circuit leads.

2. The Method of claim 1 wherein the most comprises an organic solvent.

3. The method of claim 1 wherein the mist is an aqueous mist.

4. The method of claim 3 wherein the aqueous mist comprises deionized water.

5. The method of claim 1 comprising misting the panel at ambient temperature.

6. The method of claim 1 comprising immersing the misted panel in a presoaking solution, and thereafter immersing the panel into the plating solution.

7. The method of claim 1 comprising immersing the misted panel directly into the plating solution.

8. The method of claim 1 comprising screen imaging the resist.

9. The method of claim 1 comprising photolithographically imaging the resist.

10. The method of claim 1 comprising forming the mist by ultrasonic humidification.

11. A method of fabricating a microelectronic circuit package having copper circuitry of enhanced adherence, said method comprising: depositing resist on a panel to be circuitized, exposing and developing the resist to photolithographically define portions of the panel intended to be circuitized, wetting the resist and panel with a deionized water mist of very fine droplets, immersing the mist wetted panel into a copper plating solution, and depositing copper onto regions of the panel not overlaid with resist to form circuit leads.

12. The method of claim 11 comprising misting the panel at ambient temperature.

13. The method of claim 11 comprising forming the mist by ultrasonic humidification.

14. A method of fabricating a microelectronic circuit package panel having bias or through holes, said method comprising: forming said vias or through holes, wetting the interior surfaces of the vias or through holes with a deionized water mist of very fine droplets, forming a deposit within said vias or through holes.

* * * * *

UNITED STATES PATENT AND TRADEMARK OFFICE
CERTIFICATE OF CORRECTION

PATENT NO.   : 5,166,037

DATED        : November 24, 1992

INVENTOR(S) : John M. Atkinson, et al

It is certified that error appears in the above-identified patent and that said Letters Patent is hereby corrected as shown below:

Column 8, Line 3, Claim #2; delete "most", therefor substitute --mist--.

Column 8, Line 38, Claim #14, delete "bias", therefor substitute --vias--.

Signed and Sealed this

Twenty-first Day of December, 1993

Attest:

BRUCE LEHMAN

Attesting Officer    Commissioner of Patents and Trademarks